(12) United States Patent
Makarovic

(10) Patent No.: US 7,869,001 B2
(45) Date of Patent: Jan. 11, 2011

(54) EDDY CURRENT DAMPER, AND LITHOGRAPHIC APPARATUS HAVING AN EDDY CURRENT DAMPER

(75) Inventor: Juraj Makarovic, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 1044 days.

(21) Appl. No.: 11/594,233

(22) Filed: Nov. 8, 2006

(65) Prior Publication Data

US 2008/0106361 A1    May 8, 2008

(51) Int. Cl.
*G03B 27/58* (2006.01)
*G03B 27/62* (2006.01)

(52) U.S. Cl. .......................... 355/72; 355/75
(58) Field of Classification Search ............ 355/72, 355/75; 310/90.5; 335/100
See application file for complete search history.

(56) References Cited

U.S. PATENT DOCUMENTS

2005/0190351 A1 * 9/2005 Cox et al. .................. 355/53

FOREIGN PATENT DOCUMENTS

| JP | 4-337140 A | 11/1992 |
| JP | 4-362334 A | 12/1992 |
| JP | 04362334 A | * 12/1992 |
| JP | 10-129585 A | 5/1998 |

OTHER PUBLICATIONS

Michael P. Perry "Eddy Current Damping Due to a Linear Periodic Array of Magnetic Poles", IEEE Transactions on Magnetics, vol. MAG-20, No. 1, pp. 149-155 (Jan. 1984).
Notice of Reasons for Rejection mailed Oct. 16, 2009 for Japanese Patent Application No. 2007-284676, 7 pgs.

* cited by examiner

*Primary Examiner*—Peter B Kim
(74) *Attorney, Agent, or Firm*—Sterne, Kessler, Goldstein & Fox P.L.L.C

(57) ABSTRACT

An eddy current damper has an electrically conducting body having a face, and an array of magnets extending over the face of the conducting body. Each magnet generates a magnetic field directed essentially transversely to the face of the conducting body. The magnet array generates oppositely directed magnetic fields each having a field width. At least one of the magnetic fields generated by the magnets has a field width that is smaller than a field width of an adjacent magnetic field. The conducting body may have an opening having a width that is smaller than a field width of a corresponding magnetic field.

9 Claims, 6 Drawing Sheets

EDDY CURRENT DAMPER, AND LITHOGRAPHIC APPARATUS HAVING AN EDDY CURRENT DAMPER

BACKGROUND

1. Field of the Invention

The present invention relates to an eddy current damper, and a lithographic apparatus having an eddy current damper.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

A lithographic apparatus contains a plurality of parts where one part is movable relative to another part. Examples of movable parts are a reticle or patterning device support, a wafer or substrate support, a balance mass, etc. Undesired movements of such parts may need to be damped. Such damping may be performed using at least an eddy current damper. However, the use of such an eddy current damper is not limited to lithographic apparatus, and may generally extend to apparatus having parts being movable relative to each other.

Eddy current dampers may use a set of permanent magnets or electromagnets as a source of magnetic field to be coupled to one part of an apparatus, and a body of an electrically conducting material to be coupled to another part of the apparatus, the one part and the other part being movable relative to each other, whereby eddy currents are generated in the electrically conducting body.

As a result of a relative movement of the magnets relative to the electrically conducting body, eddy currents are induced in the body. Consequently, an interaction of the eddy currents and the magnetic field of the permanent magnets generates forces between the magnets and the body that counteract the relative movement. This action is a damping or braking action that is proportional to electrical power produced by the eddy currents, and dissipated in the body. An eddy current damper is applicable both in apparatus with rotary relative movements and in apparatus with linear movements to generate a braking force, or to damp axial or radial vibrations.

The damping of an eddy current damper with a periodic array of magnetic poles is a function of many parameters. When focusing on a damping as a function of a relative movement frequency, it can be observed that the damping decreases significantly at frequencies above a cut-off frequency. The cut-off frequency is determined by a ratio of resistance over inductance of an imaginary coil created in the electrically conducting body of the eddy current damper.

Referring to M. P. Perry "Eddy currents damping due to a linear periodic array of magnetic poles", IEEE Transactions on Magnetics, Vol. MAG-20, No. 1, January 1984, pages 149-155, if a high damping should be obtained at low frequencies, then a ratio of pole pitch of the magnets over a size of a gap between the magnets and the electrically conducting body should be high. However, the pole pitch is proportional to the coil inductance, and consequently an increase of the pole pitch results in an increase of the inductance and thus a decrease of the cut-off frequency. For this reason, although a high damping may be reached at low frequencies by choosing a large pole pitch, the damping will decrease at relatively low frequencies, and the resulting damper will have a low damping at high frequencies.

SUMMARY

It is desirable to provide an eddy current damper having an effective damping extending over a wide range of frequencies.

According to an embodiment of the invention, there is provided an eddy current damper, including an electrically conducting body having a face, and an array of magnets extending over the face, each magnet generating a magnetic field directed essentially transversely to the face, the magnet array generating oppositely directed magnetic fields each having a field width, wherein at least one of the magnetic fields generated by the magnets has a field width that is smaller than a field width of an adjacent magnetic field.

According to an embodiment of the invention, there is provided an eddy current damper, including an electrically conducting body having a face, and an array of magnets extending over the face, each magnet generating a magnetic field directed essentially transversely to the face, the magnet array generating oppositely directed magnetic fields each having a field width, wherein the conducting body has an opening having a width that is smaller than a field width of a corresponding magnetic field.

According to an embodiment of the invention, there is provided a lithographic apparatus including: an illumination system configured to condition a radiation beam; a patterning support constructed to support a patterning device, the patterning device being capable of imparting the radiation beam with a pattern in its cross-section to form a patterned radiation beam; a substrate support constructed to hold a substrate; and a projection system configured to project the patterned radiation beam onto a target portion of the substrate, wherein at least one of the patterning support and the substrate support are coupled to an eddy current damper according to an embodiment of the invention.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
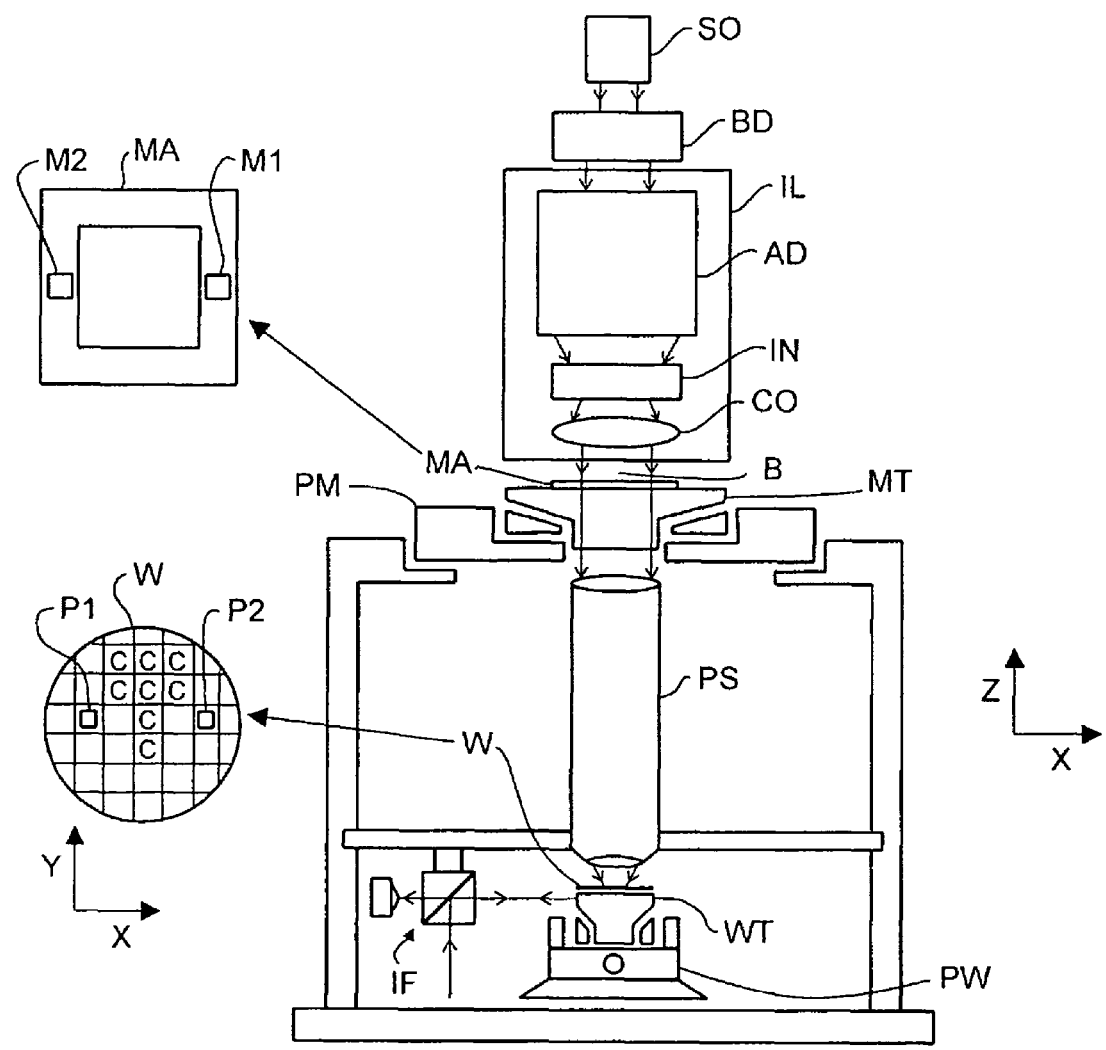
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask or patterning device support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

Any of the mask table MT, the first positioning device PM, the substrate table WT and the second positioning device PW may be coupled to an eddy current damper according to the present invention to be described below with reference to FIGS. 2-10.

The depicted apparatus could be used in at least one of the following modes:

1. In step mode, the mask table MT or "mask support" and the substrate table WT or "substrate support" are kept essentially stationary, while an entire pattern imparted to the radiation beam is projected onto a target portion C at once (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the mask table MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above-described modes of use or entirely different modes of use may also be employed.

Figure 2:
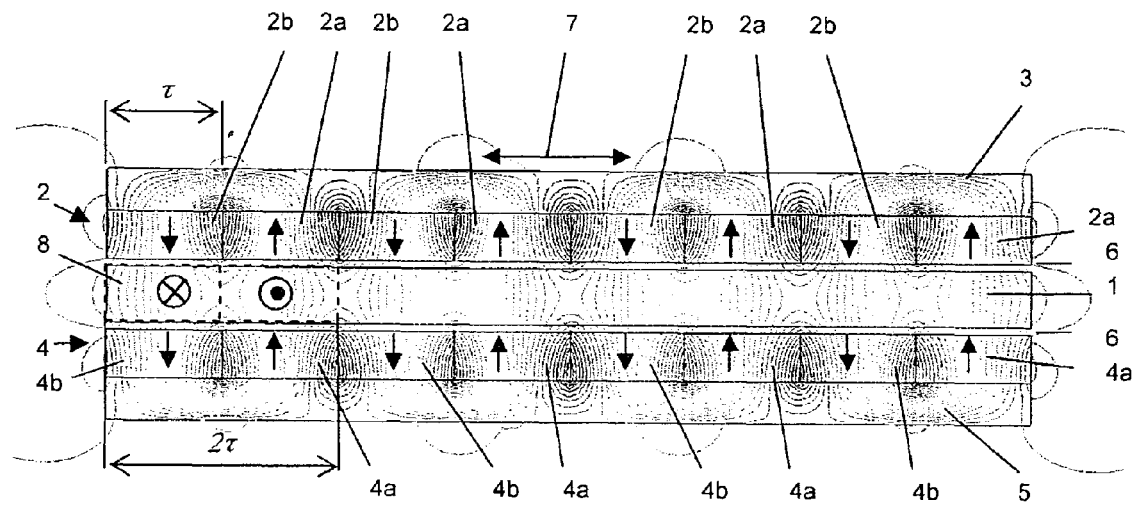
FIG. 2 depicts a cross-section of a conventional eddy current damper.

FIG. 2 shows a conventional eddy current damper including a conducting body 1, such as a plate, from an electrically conducting material, a first magnet array 2 of permanent magnets 2a, 2b mounted on a ferromagnetic body 3, such as a plate, and a second magnet array 4 of permanent magnets 4a, 4b mounted on a ferromagnetic body 5, such as a plate. In combination, the first magnet array 2, the second magnet array 4, and the ferromagnetic bodies 3, 5 are also referred to as a field assembly. Each permanent magnet 2a has the same direction of polarization, as indicated by an arrow without reference numeral. The same goes for the permanent magnets 2b, for the permanent magnets 4a, and for the permanent magnets 4b. The permanent magnets 2a and 2b are arranged alternatingly, whereby also the direction of polarization of the permanent magnets alternates. The same goes for the permanent magnets 4a and 4b. The magnet arrays 2 and 4 create a magnetic field of which the lines are indicated in the Figure.

The first magnet array 2, the second magnet array 4, and the ferromagnetic bodies 3, 5 are coupled to each other to form the field assembly as one part of the eddy current damper, whereas another part of the eddy current damper is formed by the conducting body 1. Both parts are spaced from each other through a double gap 6, such as an air gap, and movable relative to each other in either one of, or both directions as indicated by double arrow 7. The movement causes the permanent magnets 2a, 2b, 4a, 4b to induce eddy currents in the conducting body 1 (as indicated at the left-hand part of the conducting body 1) to generate a force acting between the parts counteracting the movement. Thus, the movement is damped.

In general, the damping of an eddy current damper with a periodic array of magnetic poles, when analyzed as a function of a relative movement frequency, has a cut-off frequency above which the damping decreases significantly. In the following, an analysis of the parameters determining the cut-off frequency is made.

A damping appears in a force balance equation, which describes rigid body dynamics. The damping d is equal to $$d = -\frac{F}{v} \quad (1)$$

where F is a force acting on a body, and v is a velocity of the body.

The damping of an eddy current damper can be written as a first order equation in a frequency domain $$d = -\frac{k^2}{R_{coil} + j\omega L_{coil}} \quad (2)$$

where k is a coefficient of an eddy current damper, $R_{coil}$ is a resistance of a coil, $L_{coil}$ is an inductance of the coil and $\omega$ is the electric angular frequency. The coil may include one or more windings of a conducting material, or may be defined by a shape of eddy currents induced in a body of conducting material, such as the conducting body 1. Equation (2) shows that the damping is proportional to the square of k and inversely proportional to the impedance of the coil.

The cut-off frequency $f_{cutoff}$ of the damping is $$f_{cutoff} = -\frac{R_{coil}}{2\pi \cdot L_{coil}}. \tag{3}$$

In the following paragraphs, k, $R_{coil}$ and $L_{coil}$ are derived and dependencies become more transparent.

The coefficient of damper k is usually considered as a constant that is dependent only on parameters of magnetic circuit (dimensions, permanent flux density $B_r$ and coercive field intensity $H_c$ of permanent magnets, etc.).

In the simplest case, the damping d can be derived starting from a Lorentz force equation $$F = Q(E + \vec{v} \times B) \tag{4}$$

Neglecting Coulomb's force FC $$F_C = Q(E) \tag{5}$$

the force F produced in the damper is $$F = Q(\vec{v} \times B) \tag{6}$$

Knowing the motional electric field $E_m$ $$E_m = \vec{v} \times B_{gap} \tag{7}$$

the induced voltage $V_{coil}$ in the coil parts is $$V_{coil} = \int_l E_m dl = k \cdot v \tag{8}$$

Then, the total current flowing in the coil can be derived from a voltage equation $$0 = i_{coil} \cdot R_{coil} + L_{coil} \frac{di_{coil}}{dt} + V_{coil} = i_{coil} \cdot R_{coil} + L_{coil} \frac{di_{coil}}{dt} + k \cdot v \tag{9}$$

In the frequency domain, this yields:

$$i_{coil} = \frac{k \cdot v}{(R_{coil} + j\omega L_{coil})} \tag{10}$$

Finally, the damping of the system is found as:

$$d = -\frac{F}{v} = -\frac{k \cdot i_{coil}}{v} = -\frac{k^2}{R_{coil} + j\omega L_{coil}} \tag{11}$$

where:
F is a force created by the damper,
$B_{gap}$ is a magnetic field in a gap of the damper,
$i_{coil}$ is an induced eddy current,
$V_{coil}$ is an induced voltage in coil parts under the permanent magnets,
ω is an angular frequency of vibrations,
$R_{coil}$ is a resistance of the coil, and
v is a velocity of the coil.

From a mechanical point of view only the real part of equation (11) is the mechanical damping:

$$d = \text{Re}\left[-\frac{k^2}{R_{coil} + j\omega L_{coil}}\right] \tag{12}$$

As can be seen from equation (12), the mechanical damping has a significantly decreasing tendency for frequencies above a cut-off frequency. The frequency is proportional to a ratio of resistance over inductance.

The coil, considered in resistance and inductance estimations, is defined by induced eddy currents. This means that dimensions of the coil are coupled with the permanent magnet dimensions.

Resistance of the coil consists of four serial resistances, two end connections and two straight parts of the coil between the permanent magnets. Considering average dimensions of current path, the resistance of the coil can be expressed as two times the resistance of an end connection of the coil (parallel to the plane of the drawing) plus two times the resistance of a straight part of the coil (at right angles to the plane of the drawing):

$$R_{coil} = 2 \cdot \rho \frac{\tau}{A} + 2 \cdot \rho \frac{l_{PM}}{A} \tag{13}$$

where ρ is the specific resistance of the used conductor, τ is the pole pitch of the permanent magnets representing the average length of the end connections, $l_{PM}$ is the length of the magnets that is equal to an average length of the straight parts of the coil and A is the average cross-section of the coil. The cross-section of the coil may be approximated by $$A = \tau \cdot h_{coil} \tag{14}$$

where:
$h_{coil}$ is a height of the coil.

An analytical equation of the inductance of the eddy current damper has a complex form. In order to show a main dependency of the coil inductance on the permanent magnet dimensions, the inductance can be calculated from an equation of two parallel wires in air:

$$L_{coil} = \frac{\mu_0 l_{PM}}{\pi} \ln \frac{\tau}{h} \tag{15}$$

where $\mu_0$ is the magnetic permeability of air.

From equations (3), (13), (14) and (15) it appears that $R_{coil}$ decreases with increasing pole pitch τ, $L_{coil}$ increases with increasing pole pitch τ, and consequently the cut-off frequency $f_{cutoff}$ decreases with increasing pole pitch.

Returning to FIG. 2, when a pole pitch of the permanent magnets 2a, 2b and the permanent magnets 4a, 4b is τ, the induced currents in the conducting body 1 form coils 8 with a periodicity of 2τ. Consequently, a self inductance $L_{coil}$ of the created coils is related to 2τ.

Figure 3:
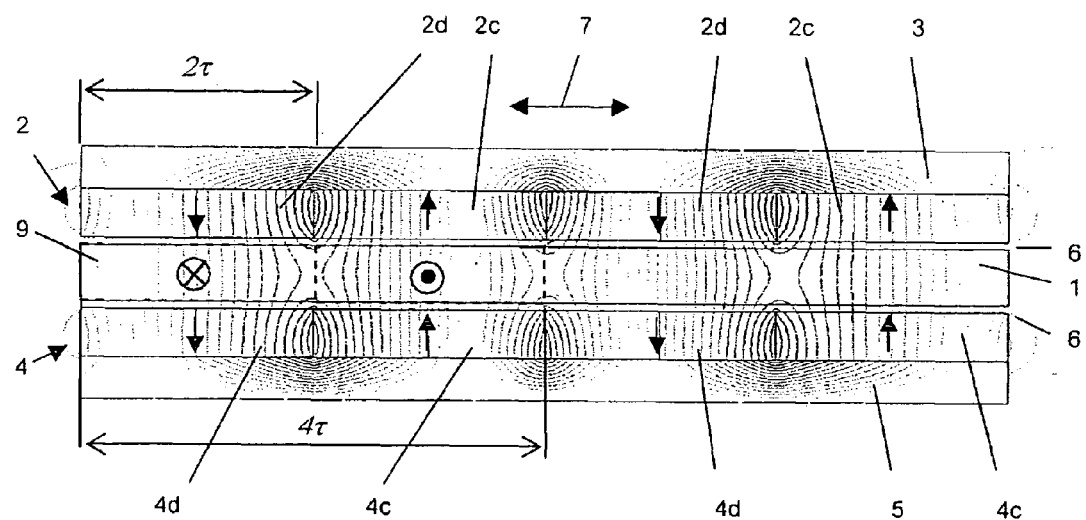
FIG. 3 depicts another cross-section of a conventional eddy current damper.

If a damping of the eddy current damper of FIG. 2 is to be increased by increasing the pole pitch of the permanent magnets, according to the prior art this may be done as illustrated by the embodiment of an eddy current damper of FIG. 3.

According to FIG. 3, an eddy current damper includes a conducting body 1, such as a plate, from an electrically conducting material, a first magnet array 2 of permanent magnets 2c, 2d mounted on a ferromagnetic body 3, such as a plate, and a second magnet array 4 of permanent magnets 4c, 4d mounted on a ferromagnetic body 5, such as a plate. Each permanent magnet 2c, 2d, 4c, 4d has a direction of polarization, as indicated by an arrow without reference numeral. The magnet arrays 2 and 4 create a magnetic field of which the lines are indicated in the Figure.

For simplicity of discussion, in the embodiment of FIG. 3 a pole pitch of the permanent magnets of 2τ is selected. Consequently, coils 9 thus created in the conducting body 1 have a periodicity of 4τ. The self inductance $L_{coil}$ of the coils now is related to 4τ, and therefore larger than the self inductance of the coils with periodicity of 2τ of the eddy current damper of FIG. 2. As a result, the eddy current damper of FIG. 3 has a higher damping at low frequencies and a lower damping at high frequencies than the eddy current damper of FIG. 2.

Figure 4:
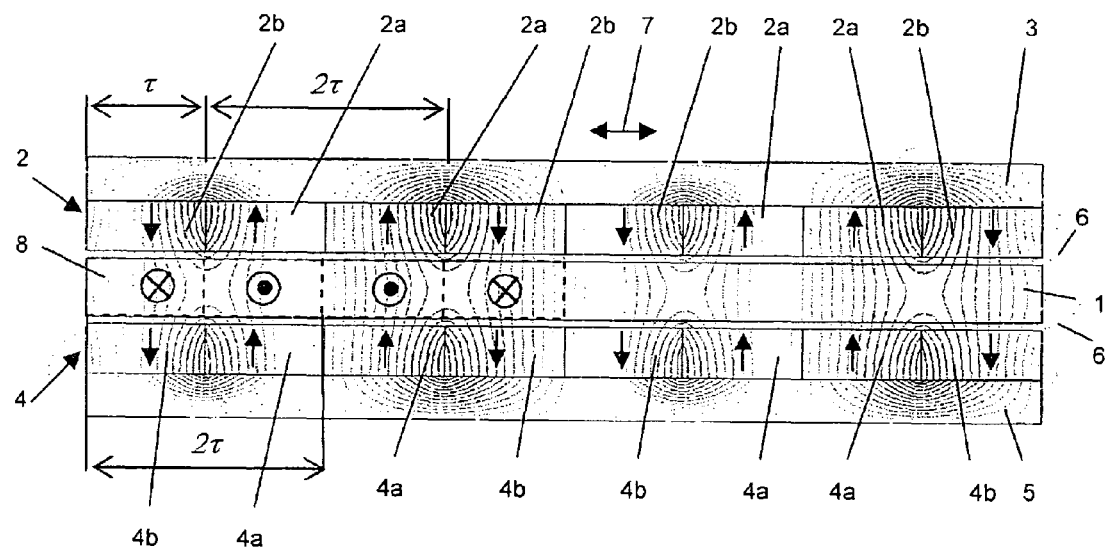
FIG. 4 depicts a cross-section of an eddy current damper according to an embodiment of the present invention.

According to FIG. 4, an eddy current damper includes a conducting body 1, such as a plate, from an electrically conducting material, a first magnet array 2 of permanent magnets 2a, 2b mounted on a ferromagnetic body 3, such as a plate, and a magnet second array 4 of permanent magnets 4a, 4b mounted on a ferromagnetic body 5, such as a plate. Each permanent magnet 2a, 2b, 4a, 4b has a direction of polarization, as indicated by an arrow without reference numeral. The magnet arrays 2 and 4 create a magnetic field of which the lines are indicated in the Figure.

When comparing FIG. 4 with FIG. 2, it will be appreciated that the permanent magnets 2a, 2b in FIG. 4 have been arranged such that they form a combination of pole pitch τ and pole pitch 2τ, and consequently the magnet arrays 2 and 4 of FIG. 4 will force the induced eddy currents in the conducting body 1 to form coils 8 with a periodicity of τ and with a periodicity of 2τ.

An induced eddy current in the conducting body 1 between a permanent magnet 2b and a permanent magnet 4b at the left-hand or the right-hand side of FIG. 4 (these magnets are also referred to as "coil-forcing" magnets) is substantially half of an induced eddy current between the adjacent pairs of permanent magnets 2a and 4a. A first half of the induced eddy current between the pairs of permanent magnets 2a, 4a closes its current path between the permanent magnets 2b, 4b, and a second half of the induced eddy current between the pairs of permanent magnets 2a, 4a closes its current path between a next pair of permanent magnets 2b, 4b. Thus, in the embodiment of FIG. 4, the current between pairs of permanent magnets is forced to split into two parts, and this will create periodically repeating coils of approximately the same dimensions as in the case depicted in FIG. 2, as well as periodically repeating coils of approximately the same dimension as in the case depicted in FIG. 3.

In this way, according to an embodiment of the invention, an eddy current damper being effective across a wide frequency range can be created. The eddy current damper of FIG. 4 will have the high damping of the eddy current damper of FIG. 3 at relatively low frequencies, and also a higher damping than the eddy current damper of FIG. 3 at relatively high frequencies. Thus, a settling time of device parts coupled to the eddy current damper may be reduced, and a performance of the device may increase in terms of higher throughput, higher acceleration levels and higher forces of drives. As an example, an eddy current damper designed to be operative in a frequency range of vibrations of 0-50 Hz may reach an approximately 30% higher damping over the whole frequency range during operation. Further, the magnetic flux in the eddy current damper according to an embodiment of the invention with coil forcing magnet is distributed differently from the magnetic flux in a conventional eddy current damper, which allows for the use of smaller ferromagnetic bodies, thereby reducing the total volume of the eddy current damper according to an embodiment of the invention. The same principle can also be used in linear motors/actuators with the same result: a reduction of the total volume of the ferromagnetic yoke.

From a manufacturing and a manufacturing cost point of view, it may be useful to assemble the eddy current damper of FIG. 4 from permanent magnets 2a, 2b, 4a, 4b which are identical. However, instead of using pairs of permanent magnets 2a, 2b, 4a, 4b, permanent magnets having the size of a pair of magnets may be used.

Figure 5:
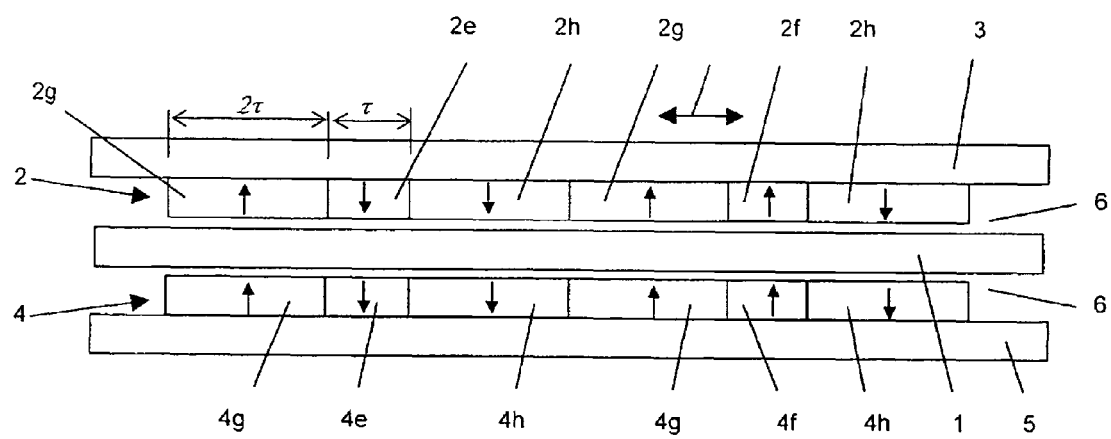
FIG. 5 depicts a cross-section of an eddy current damper according to a further embodiment of the present invention.

Referring to FIG. 5, in an embodiment of the present invention coil-forcing magnets 2e, 4e, and 2f, 4f having a pole pitch τ may also be included in between periodically arranged permanent magnets 2g, 2h, 4g, 4h having a higher pole pitch 2τ, and need not be situated at a beginning or end of a periodic permanent magnet array such as shown in FIG. 4.

Figure 6:
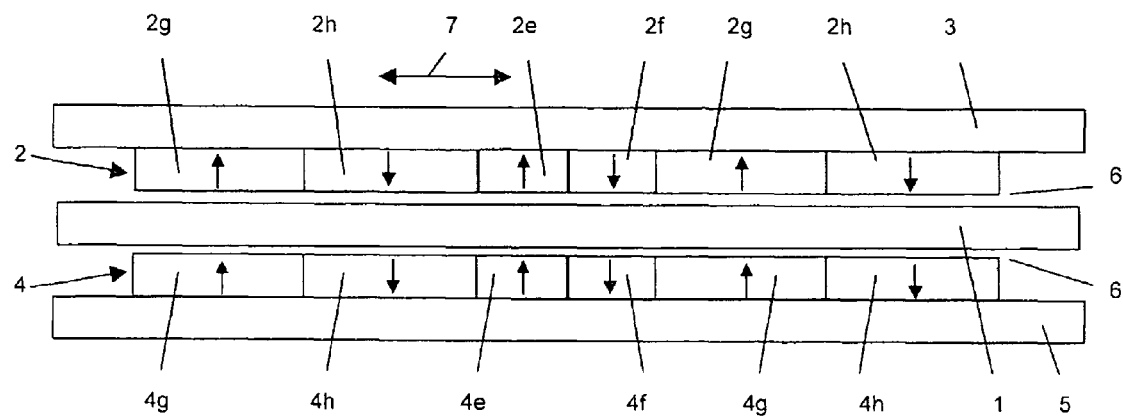
FIG. 6 depicts a cross-section of an eddy current damper according to an embodiment of the present invention.

Referring to FIG. 6, in an embodiment of the present invention, coil-forcing magnets 2e, 4e, and 2f, 4f having a pole pitch τ may also be arranged next to each other in between periodically arranged permanent magnets 2g, 2h, 4g, 4h having a higher pole pitch 2τ.

Figure 7:
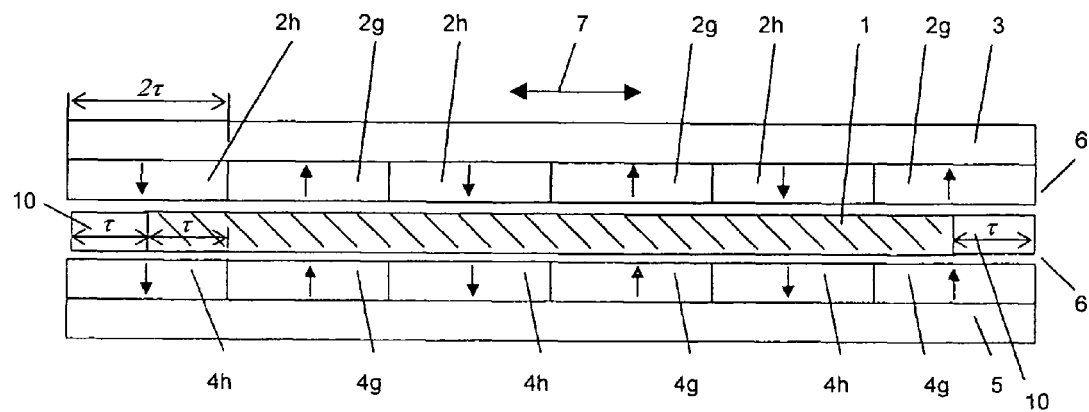
FIG. 7 depicts a cross-section of an eddy current damper according to an embodiment of the present invention.

Referring to FIG. 7, in an embodiment of the present invention the effect of an increased damping at high frequencies can also be reached by having the conducting body 1 extending between only half of the permanent magnets 2g, 4g, and 2h, 4h at the right-hand side and the left-hand side, respectively, of the conducting body 1 in the Figure, whereas the permanent magnet arrays 2 and 4 include identical periodically arranged permanent magnets 2g, 2h, 4g, 4h, and no coil-forcing magnets. Seen from another perspective, the conducting body 1 includes a cut-out 10 at two opposite ends, each cut-out 10 having a width τ which is essentially half the width 2τ of a permanent magnet 2g, 2h, 4g, 4h.

Figure 8:
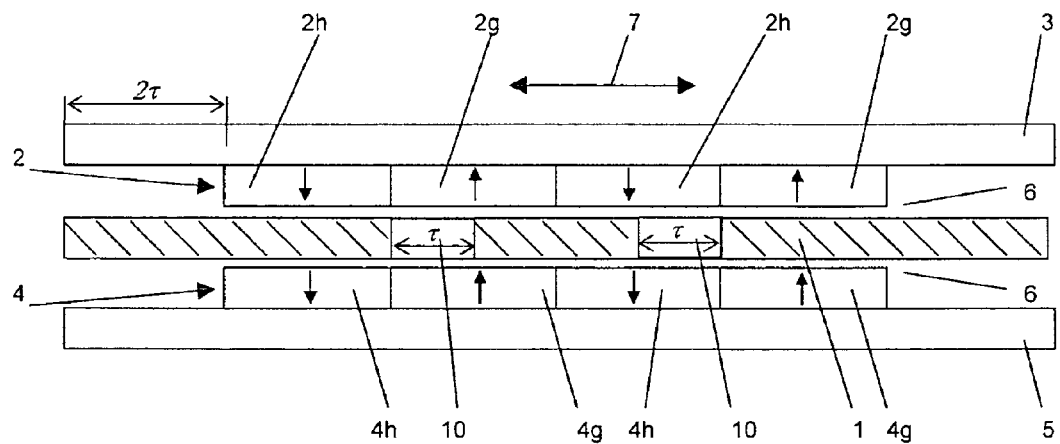
FIG. 8 depicts a cross-section of an eddy current damper according to a further embodiment of the present invention.
Figure 9:
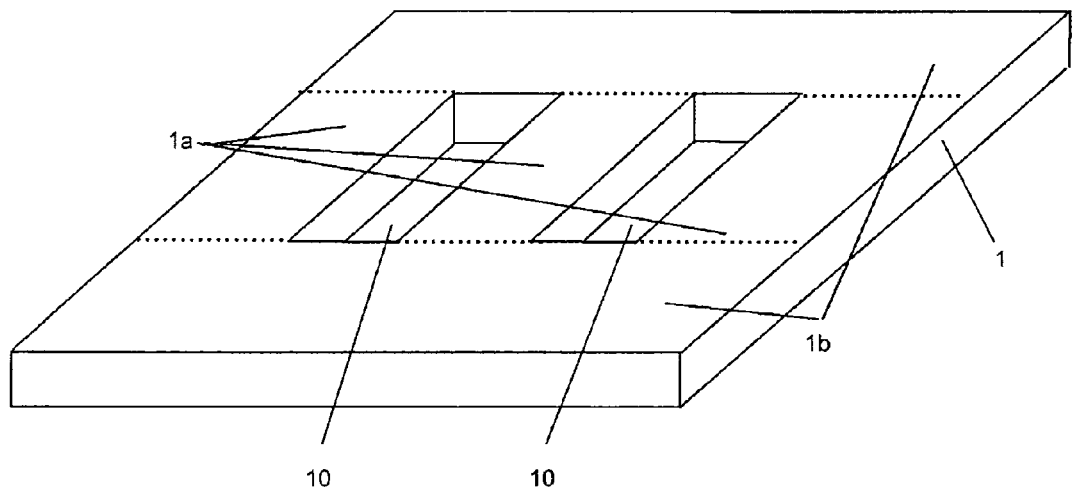
FIG. 9 depicts a perspective view of a conducting body of the eddy current damper of FIG. 8.

As illustrated in FIGS. 8 and 9, cut-outs 10 of the conducting body 1 having a width τ which is essentially half the width 2τ of a permanent magnet 2g, 2h, 4g, 4h, may also be situated between permanent magnets 2g, 4g, 2h, 4h not situated at opposite ends of the conducting body 1. In FIG. 9, parts 1a of the conducting body 1 form legs of coils of induced eddy currents, and parts 1b of the conducting body 1 form end connections of coils of induced eddy currents.

Figure 10:
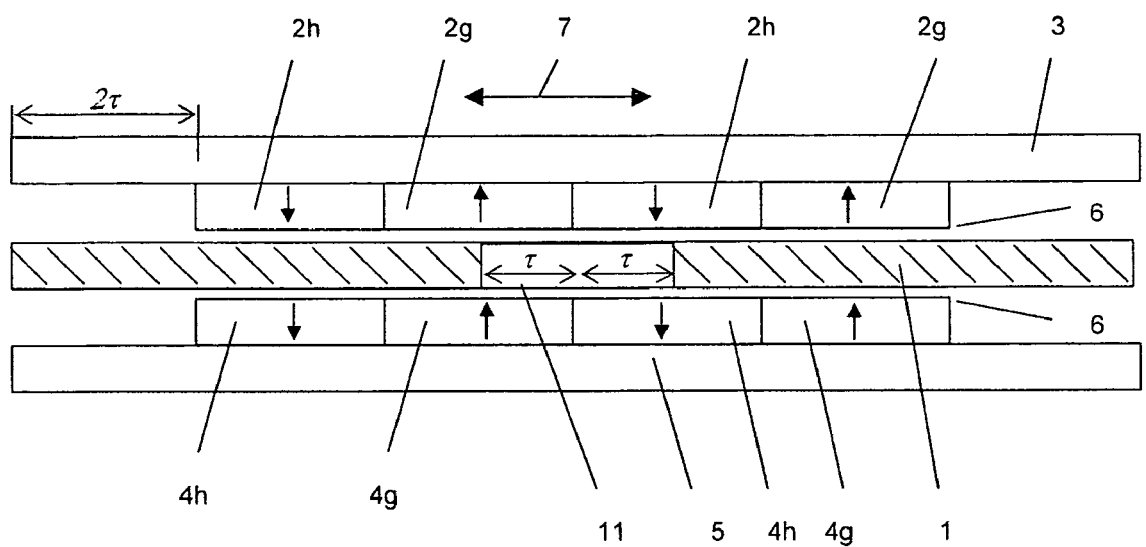
FIG. 10 depicts a cross-section of an eddy current damper according to an embodiment of the present invention.

As further illustrated in FIG. 10, a cut-out 11 having a width 2τ (to be regarded as a pair of cut-outs 10 each having a width τ) may also be used whereby half of the cut-out 11 is situated between permanent magnets 2g, 4g, and the other half of the cut-out 11 is situated between permanent magnets 2h, 4h, each permanent magnet 2g, 2h, 4g, 4h having a width 2τ.

In FIGS. 2-8 and 10, eddy current dampers have been shown including a conducting body 1 being movable between, and facing at both sides arrays of permanent magnets 2, 4. Other embodiments according to the invention may include a conducting body facing an array of permanent magnets at only one side thereof, and/or may include more than one conducting body and more than two permanent magnet arrays.

The magnet arrays, conducting body and ferromagnetic bodies may be configured to damp a linear movement or a rotary movement by selecting an appropriate design.

In FIGS. 2-6, the present invention is illustrated in embodiments including coil-forcing magnets, whereas in FIGS. 7-10, the present invention is illustrated in embodiments having a conducting body including one or more cut-outs. It will be appreciated that other embodiments according to the invention may include coil-forcing magnets as well as cut-outs.

Further it should be noted that other ratios between field widths/magnet widths of magnets than about 0.5 as illustrated in FIGS. 4-6 may be chosen, lying in the range between about 0 and 1. Similarly, other ratios between openings and magnet widths than about 0.5 as illustrated in FIGS. 7-10 may be chosen, lying in the range between about 0 and 1.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The descriptions above are intended to be illustrative, not limiting. Thus, it will be apparent to one skilled in the art that modifications may be made to the invention as described without departing from the scope of the claims set out below.

As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting; but rather, to provide an understandable description of the invention.

The terms "a" or "an", as used herein, are defined as one or more than one. The term plurality, as used herein, is defined as two or more than two. The term another, as used herein, is defined as at least a second or more. The terms including and/or having, as used herein, are defined as including (i.e., open language). The term coupled, as used herein, is defined as connected, although not necessarily directly, and not necessarily mechanically.

What is claimed is:

1. A lithographic apparatus comprising:
an illumination system configured to condition a radiation beam;
a patterning support constructed to support a patterning device, the patterning device being capable of imparting the radiation beam with a pattern in its cross-section to form a patterned radiation beam;
a substrate support constructed to hold a substrate; and
a projection system configured to project the patterned radiation beam onto a target portion of the substrate,
wherein at least one of the patterning support or the substrate support are coupled to an eddy current damper, the eddy current damper comprising,
an electrically conducting body having a face; and
an array of magnets extending over the face, each magnet configured to generate a magnetic field directed essentially transversely to the face, the array of magnets configured to generate oppositely directed magnetic fields each having a field width,
wherein at least one of the magnetic fields generated by the magnets has a field width that is smaller than a field width of an adjacent magnetic field, and
wherein the field width that is smaller than the field width of the adjacent magnetic field is located anywhere other than an end of the array of magnets.

2. The lithographic apparatus of claim 1, wherein each magnet has a magnet width, and at least one of the magnets has a magnet width that is smaller than the magnet width of an adjacent magnet.

3. The lithographic apparatus of claim 2, wherein the at least one of the magnets has a magnet width that is about half the magnet width of an adjacent magnet.

4. The lithographic apparatus of claim 2, wherein the at least one of the magnets is located anywhere other than at the end of the array of magnets.

5. The lithographic apparatus of claim 1, wherein the magnets are permanent magnets.

6. The lithographic apparatus of claim 1, wherein the conducting body is a plate.

7. A lithographic apparatus comprising:
an illumination system configured to condition a radiation beam;
a patterning support constructed to support a patterning device, the patterning device being capable of imparting the radiation beam with a pattern in its cross-section to form a patterned radiation beam;
a substrate support constructed to hold a substrate; and
a projection system configured to project the patterned radiation beam onto a target portion of the substrate, wherein at least one of the patterning support or the substrate support are coupled to an eddy current damper, the eddy current damper comprising an electrically conducting body having a face; and an array of magnets extending over the face, each magnet configured to generate a magnetic field directed essentially transversely to the face, the array of magnets configured to generate oppositely directed magnetic fields each having a field width, wherein the conducting body includes an opening having a width that is smaller than a field width of a corresponding magnetic field.

8. The lithographic apparatus of claim 7, wherein the opening is located at an end of the electrically conducting body.

9. The lithographic apparatus of claim 7, wherein the conducting body is a plate.

* * * * *